(12) United States Patent
Kinugawa (10) Patent No.: US 12,391,487 B2
(45) Date of Patent: Aug. 19, 2025

(54) TRANSPORT FACILITY

(71) Applicant: Daifuku Co., Ltd., Osaka (JP)

(72) Inventor: Tomotaka Kinugawa, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 84 days.

(21) Appl. No.: 18/443,773

(22) Filed: Feb. 16, 2024

(65) Prior Publication Data

US 2024/0278996 A1 Aug. 22, 2024

(30) Foreign Application Priority Data

Feb. 17, 2023 (JP) ................ 2023-023371

(51) Int. Cl.
  *B65G 35/06* (2006.01)
  *B61B 13/12* (2006.01)
  *B65G 43/02* (2006.01)
  *B65G 47/64* (2006.01)

(52) U.S. Cl.
  CPC .............. *B65G 35/06* (2013.01); *B61B 13/12* (2013.01); *B65G 43/02* (2013.01); *B65G 47/64* (2013.01); *B65G 2203/0283* (2013.01)

(58) Field of Classification Search
  CPC ...... B65G 35/06; B65G 43/02; B65G 47/641; B65G 54/02; B61B 13/12
  USPC ......................................... 198/465.1, 370.03
  See application file for complete search history.

(56) References Cited

U.S. PATENT DOCUMENTS

| | | | | |
|---|---|---|---|---|
| 9,758,308 | B1* | 9/2017 | Nishikawa | ........ H01L 21/67715 |
| 11,114,323 | B2 | 9/2021 | Ogawa et al. | |
| 11,926,483 | B2* | 3/2024 | Kono | ................ H01L 21/67715 |
| 2016/0332523 | A1* | 11/2016 | Wada | ........................ B61B 3/02 |
| 2017/0183154 | A1* | 6/2017 | Kinugawa | ............ B65G 1/0457 |
| 2019/0122910 | A1 | 4/2019 | Ogawa et al. | |
| 2021/0362957 | A1* | 11/2021 | Hagiwara | ......... H01L 21/67259 |
| 2023/0234787 | A1* | 7/2023 | Otsuka | .................... B65G 47/64 |
| | | | | 198/369.1 |
| 2024/0083256 | A1* | 3/2024 | Huang | .................... B65G 35/06 |

FOREIGN PATENT DOCUMENTS

JP 201980411 A 5/2019

* cited by examiner

*Primary Examiner* — James R Bidwell
(74) *Attorney, Agent, or Firm* — The Webb Law Firm (57) ABSTRACT

A travel route of a transport facility includes a guide zone in which a guide rail is disposed and a non-guide zone in which the guide rail is not disposed. A control system causes a guide drive section to execute a confirmation operation to drive a first guided section in a width direction Y in response to occurrence of a specific event in which a transport vehicle loses information on a travel position thereof, determines that the transport vehicle is in the non-guide zone in response to the first guided section moving from a first position to a second position or from the second position to the first position, and determines that the transport vehicle is in the guide zone in response to the first guided section being prevented from moving from the first position to the second position or from the second position to the first position.

6 Claims, 4 Drawing Sheets

TRANSPORT FACILITY

CROSS-REFERENCE TO RELATED APPLICATION

This application claims priority to Japanese Patent Application No. 2023-023371 filed Feb. 17, 2023, the disclosure of which is hereby incorporated by reference in its entirety.

BACKGROUND OF THE INVENTION

1. Field of the Invention

The present invention relates to a transport facility including a transport vehicle that travels along a travel route, and a control system that controls the transport vehicle.

2. Description of Related Art

One example of such a transport facility is described in JP 2019-080411A. The reference signs in parentheses below in "Description of Related Art" are those used in this patent document. In this transport facility, a positional information reading section (23) of a transport vehicle (3) reads positional information of position display devices (26) that are at intervals along rails (2), so that the transport vehicle obtains information on the travel position, and a control system (H) controls the transport vehicle based on the obtained information.

SUMMARY OF THE INVENTION

Such a control system that controls a transport vehicle has to properly control the transport vehicle according to, for example, the shape of a travel route such as whether there are branch or merge parts or whether the route is straight or curved, the positions of various facilities at which the transport vehicle is stopped, and the like. However, in this kind of transport facility, for example, in the case in which a specific event such as a power failure in which a transport vehicle loses information on its travel position has occurred, the transport vehicle has lost information on its travel position, and thus it is difficult for the control system to properly resume control of the transport vehicle unless a worker performs a restoration work or the like to make the transport vehicle recognize its travel position.

Therefore, it is desirable to realize a transport facility in which a control system can properly resume control of a transport vehicle even if a specific event in which the transport vehicle loses information on its travel position occurs.

The present disclosure is directed to a transport facility including: a transport vehicle configured to travel along a travel route; a guide rail along the travel route; and a control system configured to control the transport vehicle, wherein, with a travel direction being a direction along the travel route, a width direction being a direction orthogonal to the travel direction in a vertical view, a first side in the width direction being one side in the width direction, and a second side in the width direction being another side in the width direction, the transport vehicle includes: a guided section configured to be guided by the guide rail; and a guide drive section configured to drive the guided section in the width direction to move the guided section to a first position on the first side in the width direction of the guide rail and to a second position on the second side in the width direction of the guide rail, the travel route includes a guide zone in which the guide rail is disposed and a non-guide zone in which the guide rail is not disposed, and, in response to occurrence of a specific event in which the transport vehicle loses information on a travel position thereof, the control system (i) causes the guide drive section to execute a confirmation operation to drive the guided section in the width direction, (ii) determines that the transport vehicle is in the non-guide zone in response to the guided section moving from the first position to the second position or from the second position to the first position in the confirmation operation, and (iii) determines that the transport vehicle is in the guide zone in response to the guided section being prevented from moving from the first position to the second position or from the second position to the first position in the confirmation operation.

This configuration makes it possible to determine whether a transport vehicle is in the guide zone or the non-guide zone, through a confirmation operation to drive the guided section in the width direction, even if a specific event in which the transport vehicle loses information on its travel position occurs. Accordingly, the control system can cause the transport vehicle to perform proper control according to whether the transport vehicle is in the guide zone or the non-guide zone. Therefore, the control system can properly resume control of the transport vehicle, even if a specific event in which the transport vehicle loses information on its travel position occurs.

DESCRIPTION OF THE INVENTION

An embodiment of a transport facility will be described below with reference to the drawings.

Figure 1:
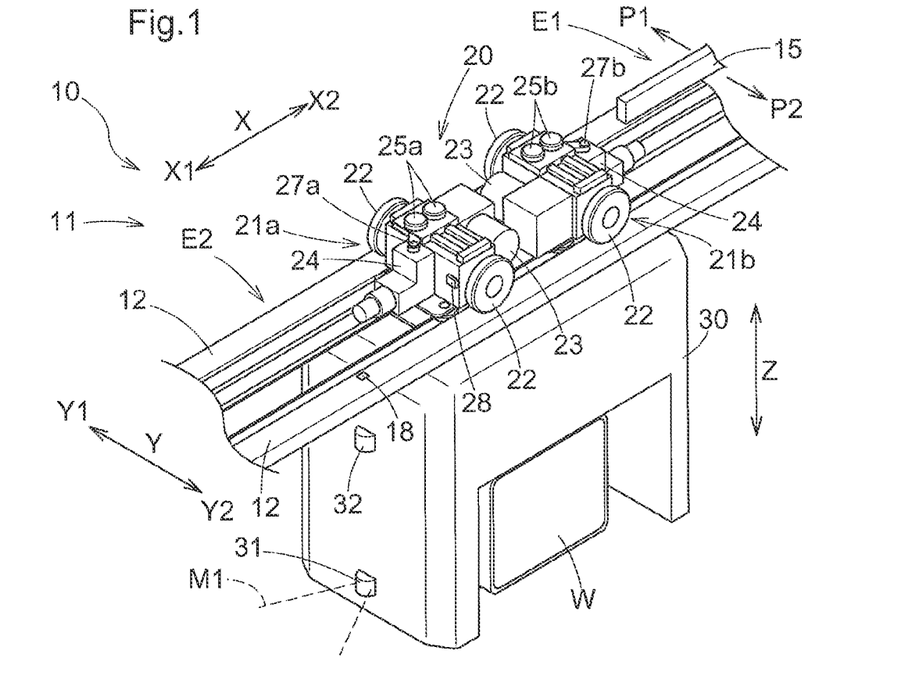
FIG. 1 is a perspective view of a transport facility according to an embodiment.

As shown in FIG. 1, a transport facility 10 includes a transport vehicle 20 that travels along a travel route 11 and a guide rail 15 along the travel route 11. The transport facility 10 in this embodiment has a plurality of transport vehicles 20. The transport vehicles 20 in this embodiment are overhead transport vehicles. The transport vehicles 20 are motorized unmanned transport vehicles. The transport vehicles 20 transport, for example, FOUPs (Front Opening Unified Pods) containing semiconductor substrates, as articles W. The transport facility 10 in this embodiment is indoors, for example, in a clean room.

A travel direction X is a direction along the travel route 11. An up-down direction Z is a vertical direction. A width direction Y is a direction orthogonal to the travel direction X in a vertical view. A first side Y1 in the width direction is one side in the width direction Y, and a second side Y2 in the width direction is the other side in the width direction Y. The travel route 11 in this embodiment has travel rails 12 along which the transport vehicles 20 travel. The travel rails 12 are a pair of rails on both sides in the width direction Y. The travel rails 12 are suspended from the ceiling.

Such travel routes 11 in this embodiment include guide zones E1 in which the guide rail 15 is disposed and non-guide zones E2 in which the guide rail 15 is not disposed. The guide rail 15 in the example shown in the drawing is along the center in the width direction Y of the travel routes 11. The guide rail 15 is between the pair of travel rails 12 in a vertical view. The guide rail 15 is suspended from the ceiling.

Figure 2:
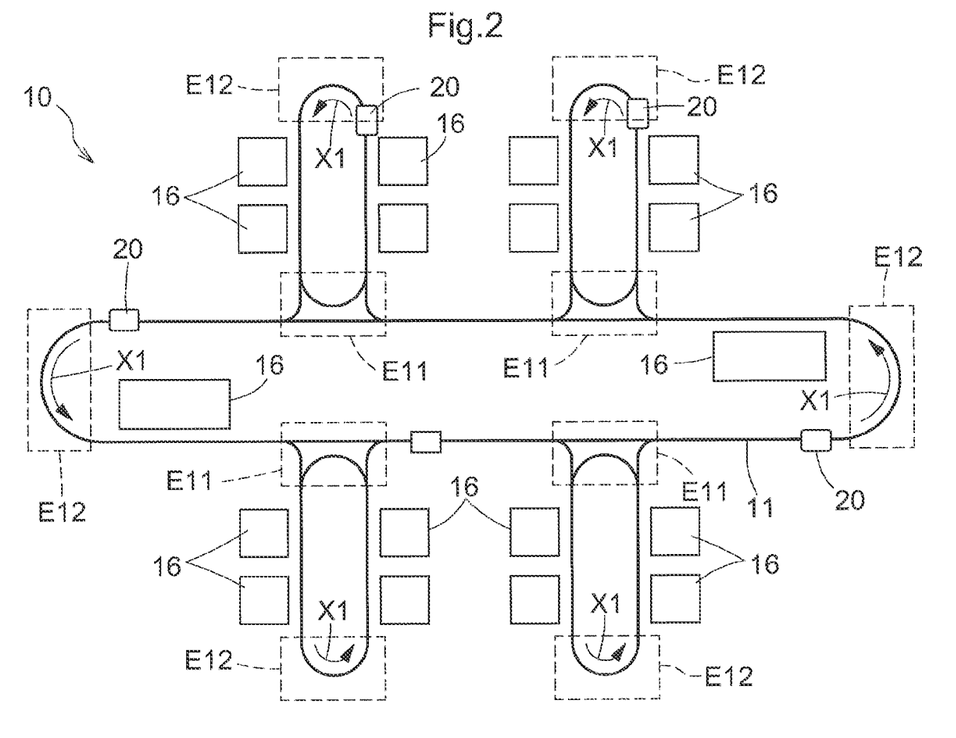
FIG. 2 is a top view of travel routes in FIG. 1.

FIG. 2 is a view showing an example of the travel routes 11. Facilities 16 such as processing devices for the articles W, article placement tables, article storage racks, and other various devices are outside in the width direction Y of the travel routes 11 in this embodiment. The transport vehicles 20 in the example shown in FIG. 2 travel in one direction along the travel routes 11. A forward side X1 is a side in an advancing direction of the transport vehicles 20 along the travel direction X, and a rearward side X2 is a side opposite to the advancing direction.

The guide rail 15 in this embodiment is in at least either intersection zones E11, in which travel routes 11 intersect each other, or curved zones E12, in which a travel route 11 is curved. The intersection zones E11 may be, for example, a branch zone, a merge zone, a cross intersection zone, or an N-shaped branch-merge zone. The curved zones E12 may be, for example, a U-shaped, S-shaped, or C-shaped zone, or other curved travel zones. The intersection zones E11 in the example shown in the drawing are branch zones and merge zones. A branch zone may be, for example, a zone in which one travel route 11 branches into a plurality of travel routes 11. A merge zone may be, for example, a zone in which a plurality of travel routes 11 merge into one travel route 11. The guide rail 15 is configured to guide the course of the transport vehicles 20 in the branch zones and the merge zones in this embodiment.

Returning to FIG. 1, each transport vehicle 20 in this embodiment includes a first travel section 21a that travels along the travel routes 11. The first travel section 21a in this embodiment includes wheels 22 that roll on the rail surfaces of the travel routes 11 and a drive section 23 for traveling that rotates the wheels 22. The drive section 23 for traveling may be, for example, an electric motor such as a servomotor, or an internal combustion engine. The rail surfaces of the travel routes 11 on which the wheels 22 roll are upward-facing faces of the travel rails 12, and the wheels 22 rotate around an axis orthogonal to the up-down direction Z.

The transport vehicle 20 includes first guided sections 25a that are guided by the guide rail 15. The first guided sections 25a in this embodiment roll on a guide face of the guide rail 15. The guide face of the guide rail 15 is a face facing one side in the width direction Y, and the first guided sections 25a rotate around axes along the up-down direction Z. The first guided sections 25a are on the first travel section 21a. The first guided sections 25a are two sections that are side by side in the travel direction X. The first guided sections 25a correspond to the "guided section".

The transport vehicle 20 includes a guide drive section 24 that drives the first guided sections 25a in the width direction Y to move the guided sections to a first position P1 on the first side Y1 in the width direction of the guide rail 15 and to a second position P2 on the second side Y2 in the width direction of the guide rail 15. The guide drive section 24 may be, for example, a solenoid actuator, an electric motor, or a hydraulic system. The guide drive section 24 in this embodiment executes a course selecting operation to switch the position of the first guided sections 25a according to the course of the transport vehicle 20 before the transport vehicle enters the guide zones E1. For example, if the transport vehicle 20 enters the branch zone shown in FIG. 4, the transport vehicle 20 advances to a branch on the first side Y1 in the width direction (the right side with respect to the advancing direction) in response to switching of the position of the first guided sections 25a to the first position P1, and the transport vehicle 20 advances to a branch on the second side Y2 in the width direction (the left side with respect to the advancing direction) in response to switching of the position of the first guided sections 25a to the second position P2.

The transport vehicle 20 in this embodiment includes, in addition to the first guided sections 25a, second guided sections 25b on the rearward side X2 in the travel direction X of the first guided sections 25a. The guide drive section 24 drives the first guided sections 25a and the second guided sections 25b independently of each other in the width direction Y. The guide drive section 24 executes a course selecting operation to switch the positions in the width direction Y of the first guided sections 25a and the second guided sections 25b independently of each other according to the course of the transport vehicle 20 before the transport vehicle enters the guide zones E1.

The transport vehicle 20 in this embodiment includes a second travel section 21b on the rearward side X2 in the travel direction X of the first travel section 21a. The second travel section 21b includes wheels 22 that roll on the rail surfaces of the travel routes 11 and a drive section 23 for traveling that rotates the wheels 22. The second travel section 21b in this embodiment includes the second guided sections 25b. The second guided sections 25b are two sections that are side by side in the travel direction X. The first guided sections 25a and the second guided sections 25b in the example shown in the drawing are guide wheels. The first guided sections 25a and the second guided sections 25b in the example shown in the drawing are guide wheels with the same diameter.

The transport vehicle 20 in this embodiment includes a body section 30 connected to the first travel section 21a. The body section 30 is on the lower side in the up-down direction Z of the first travel section 21a, and is supported by the first travel section 21a. The body section 30 is connected to the second travel section 21b as well. The body section 30 is on the lower side of the first travel section 21a and the second travel section 21b, and is supported by the first travel section 21a and the second travel section 21b. The body section 30 includes a transfer device (not shown) that transfers the articles W to a transport destination. The articles W are transported by the transport vehicle 20 with the transfer device being at a predetermined travel position.

The transport vehicle 20 in this embodiment includes a first detecting section 27a configured to detect movement in the width direction Y of the first guided sections 25a. The first detecting section 27a detects whether or not the first guided sections 25a have moved from the first position P1 to the second position P2 or from the second position P2 to the first position P1. The first detecting section 27a in this embodiment can detect whether or not the first guided sections 25a are at the first position P1. The first detecting section 27a can detect whether or not the first guided sections 25a are at the second position P2. The first detecting section 27a may be, for example, an optical sensor or a laser sensor. The transport vehicle 20 in this embodiment includes a second detecting section 27b configured to detect movement in the width direction Y of the second guided sections 25b. The second detecting section 27b has a configuration similar to that of the first detecting section 27a. Detection results of the first detecting section 27a and the second detecting section 27b are transmitted to a later-described control system 40.

A plurality of information holders 18 holding positional information on positions thereof are respectively at a plurality of points along the travel routes 11 in this embodiment. The information holders 18 in this embodiment are at intervals along the travel routes 11. The information holders 18 may be, for example, a one-dimensional bar code, a two-dimensional bar code, a number, text, an image marking, or a radio tag. The information holders 18 are, for example, on the travel rails 12, the guide rail 15, holding members holding the travel rails 12 or the guide rail 15, or the rail surfaces.

The transport vehicle 20 in this embodiment further includes a reader 28 configured to read the positional information of the information holders 18 and recognize a travel position of the transport vehicle based on the information read by the reader 28. The reader 28 may be, for example, a bar code reader, an image recognition device, a character recognition device that recognizes numbers and letters, or a wireless identification device.

The transport vehicle 20 in this embodiment further includes an obstacle sensor 31 configured to detect an obstacle on the forward side X1 in the travel direction X. The transport vehicle 20 slows down or stops, for example, in response to detection of an obstacle by the obstacle sensor 31 during travel of the transport vehicle 20. The obstacle sensor 31 can change a detection range M1. The obstacle may be, for example, workers, work robots, foreign objects, or other transport vehicles 20 on the travel routes 11. The obstacle sensor 31 may be, for example, an optical sensor, an ultrasonic sensor, an image sensor, a millimeter wave sensor, or a laser sensor. Detection results by the obstacle sensor 31 are transmitted to a later-described control system 40. Changing the detection range M1 may be performed by changing the detection range of a single obstacle sensor 31, or by switching a plurality of obstacle sensors 31 aligned in the width direction Y or the up-down direction Z on and off individually. The obstacle sensor 31 in this embodiment can project light toward the forward side X1 in the travel direction X and measure the distance to the obstacle based on reflected light. The obstacle sensor 31 is on a front face of the transport vehicle 20. The obstacle sensor 31 is on a front face of the body section 30.

The transport vehicle 20 in this embodiment includes a rear-end collision prevention sensor 32 configured to detect another transport vehicle 20 on the forward side X1 in the travel direction X. The rear-end collision prevention sensor 32 may be, for example, an optical sensor, an ultrasonic sensor, an image sensor, a millimeter wave sensor, or a laser sensor. The rear-end collision prevention sensor 32 is closer to the travel rails 12 in the up-down direction Z than the obstacle sensor 31 on the front face of the transport vehicle 20 is. The rear-end collision prevention sensor 32 in this embodiment is configured to project light toward the forward side X1 in the travel direction X and detect reflections by a reflective member on a face on the rearward side X2 of another transport vehicle 20. The rear-end collision prevention sensor 32 is on the front face of the body section 30.

Figure 3:
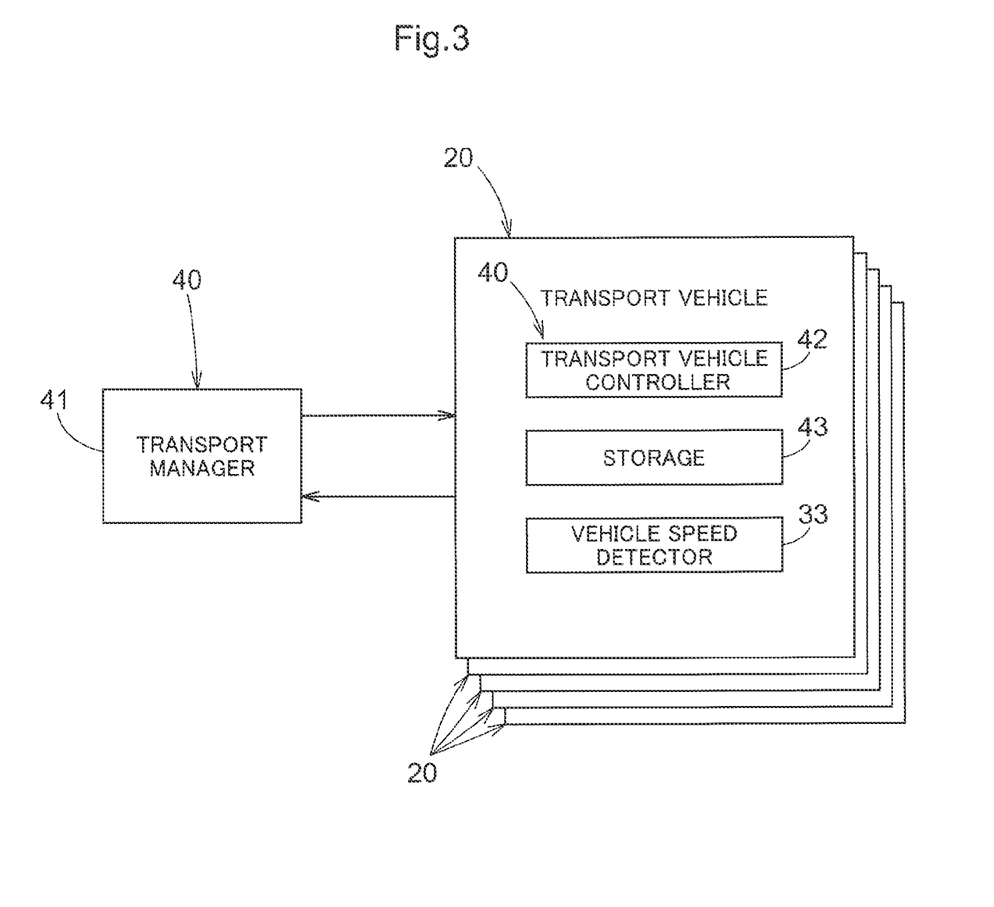
FIG. 3 is a control block diagram of the transport facility in FIG. 1.

FIG. 3 is a control block diagram of the transport facility 10. The transport facility 10 in this embodiment includes vehicle speed detectors 33 that detect travel speeds of the transport vehicles 20. The vehicle speed detectors 33 are on the transport vehicles 20. The vehicle speed detectors 33 detect travel speeds of the transport vehicles 20 by measuring rotational speeds of the pairs of wheels 22.

The transport facility 10 includes a control system 40 that controls the transport vehicles 20. The control system 40 in this embodiment controls the first travel sections 21a and the second travel sections 21b of the transport vehicles 20 and the transfer devices of the body sections 30. The functions of the control system 40 are realized, for example, through cooperation between hardware such as an arithmetic processor and a program executed on the hardware. All of the control system 40 may be in the transport vehicles 20, or part of the control system may be in control devices in the transport vehicles 20 and part of the control system may be in an external control device such as that in a centralized control room. All of the control system 40 may be in an external control device. The control system 40 in this embodiment includes an external transport manager (material control processor) 41 and transport vehicle controllers 42 respectively on the plurality of transport vehicles 20. The transport manager 41 and the transport vehicle controllers 42 are configured for wireless communication. The control system 40 in this embodiment includes storages 43 that can store information obtained by the readers 28. The storages 43 in the example shown in FIG. 3 are in the transport vehicles 20, but may be in the transport manager 41 or the transport vehicle controllers 42.

The control system 40 causes the guide drive sections 24 to execute a confirmation operation to drive the first guided sections 25a in the width direction Y in response to occurrence of a specific event in which the transport vehicles 20 lose information on their travel positions. The specific event in which the transport vehicles lose information on their travel positions may be, for example, a power failure, updating of control software from a higher-level controller, abnormal stop, power interruption by a worker, or travel of the transport vehicles 20 after a failure or power interruption. The confirmation operation in this embodiment is executed while the transport vehicles 20 are stopped. In this embodiment, in the event of a power failure, the power supply is cut off and the transport vehicles 20 are stopped. The control system 40 may execute stop processing that stops the transport vehicles 20 at predetermined positions in response to occurrence of the specific event.

The control system 40 determines that a transport vehicle 20 is in a non-guide zone E2 in response to the first guided sections 25a moving from the first position P1 to the second position P2 or from the second position P2 to the first position P1 in the confirmation operation. The control system 40 determines that a transport vehicle 20 is in a guide zone E1 in response to the first guided sections 25a being prevented from moving from the first position P1 to the second position P2 or from the second position P2 to the first position P1 during the confirmation operation. The control system 40 may be configured to determine whether a transport vehicle 20 is in a guide zone E1 or a non-guide zone E2 not through the confirmation operation to drive the first guided sections 25a in the width direction Y but through a confirmation operation to detect the guide rail 15 using a sensor or the like.

Figure 4:
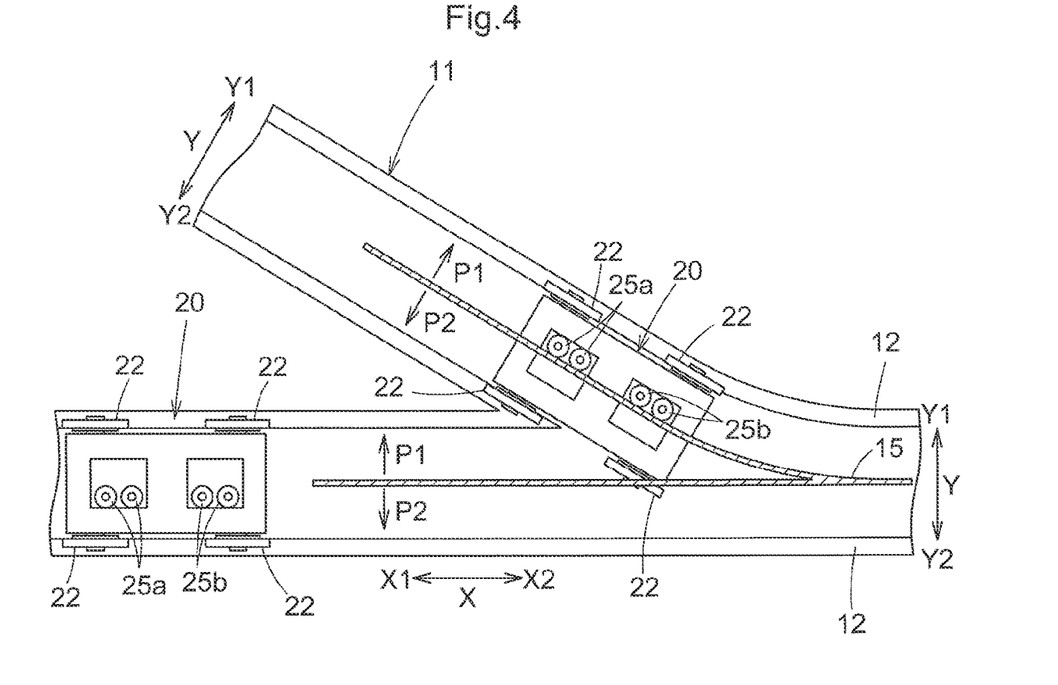
FIG. 4 is a view illustrating a confirmation operation in an intersection zone shown in FIG. 2.

FIG. 4 is a top view of a branch zone in an intersection zone E11. For example, the transport vehicle 20 on the rearward side X2 in the travel direction X in FIG. 4 has the first guided sections 25a and the second guided sections 25b at the first position P1, and the first guided sections 25a and the second guided sections 25b are prevented by the guide rail 15 from moving in the confirmation operation to drive these guided sections to the second position P2. Accordingly, the control system 40 determines that the transport vehicle 20 is in the guide zone E1. The transport vehicle 20 on the forward side X1 in the travel direction X in FIG. 4 has the first guided sections 25a and the second guided sections 25b at the second position P2, and the first guided sections 25a and the second guided sections 25b move to the first position P1 in the confirmation operation to drive the first guided sections 25a and the second guided sections 25b to the first position P1 because the movement is not prevented by the guide rail 15. Accordingly, the control system 40 determines that the transport vehicle 20 is in the non-guide zone E2. In this case, the control system 40 executes a post-determination return operation to return the first guided sections 25a and the second guided sections 25b to the original position (the second position P2).

The control system 40 in this embodiment executes the confirmation operation on both the first guided sections 25a and the second guided sections 25b in response to occurrence of the specific event. The control system 40 determines that the transport vehicle 20 is in the non-guide zone E2 in response to both the first guided sections 25a and the second guided sections 25b moving from the first position P1 to the second position P2 or from the second position P2 to the first position P1 in the confirmation operation. The control system 40 determines that the transport vehicle 20 is in the guide zone E1 in response to at least either the first guided sections 25a or the second guided sections 25b being prevented from moving from the first position P1 to the second position P2 or from the second position P2 to the first position P1 in the confirmation operation.

Figure 5:
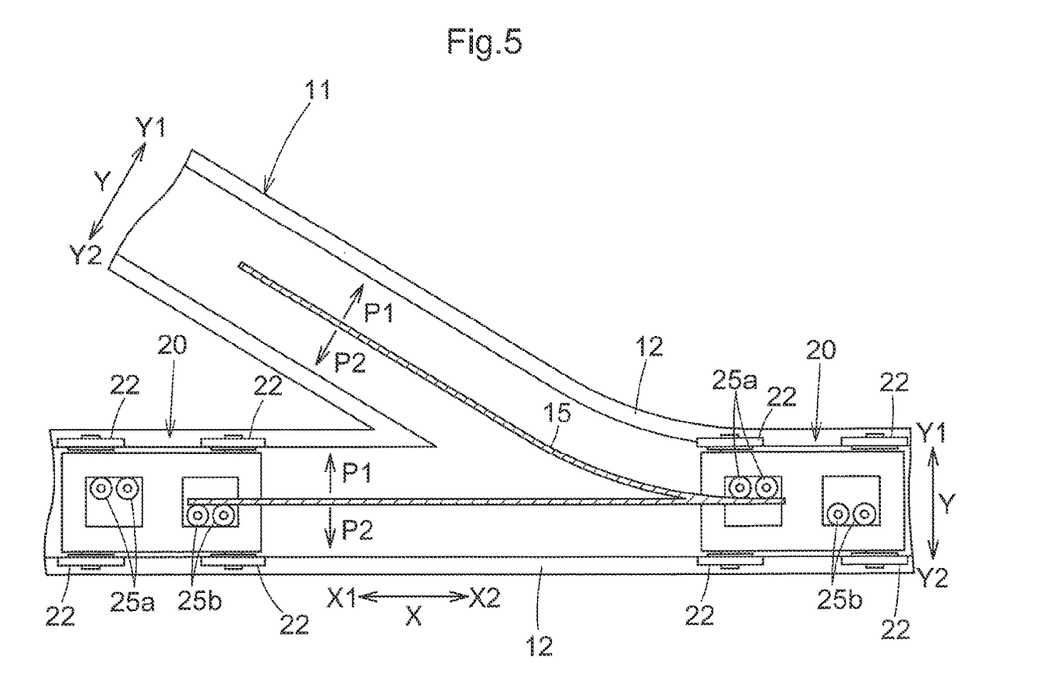
FIG. 5 is a view showing a state during the confirmation operation in the intersection zone in FIG. 4.

FIG. 5 is a view showing a state during the confirmation operation in the branch zone in the intersection zone E11. For example, the drawing shows a state in which two transport vehicles 20 shown in FIG. 5 have only the first guided sections 25a or the second guided sections 25b that have moved from the first position P1 to the second position P2 or from the second position P2 to the first position P1 in the confirmation operation. Accordingly, the control system 40 determines that both of the transport vehicles 20 are in the guide zone E1. In this case, the control system 40 executes the post-determination return operation to return the first guided sections 25a and the second guided sections 25b that have moved in the confirmation operation to the original position, which is the position before the confirmation operation.

The control system 40 may be configured to determine that a transport vehicle 20 is in a non-guide zone E2 in response to the first guided sections 25a moving from the first position P1 to the second position P2 or from the second position P2 to the first position P1 as in the case of the transport vehicle 20 on the forward side X1 in the travel direction X shown in FIG. 5. That is to say, in the case in which a transport vehicle 20 includes a plurality of guided sections, the control system 40 may be configured to determine that the transport vehicle 20 is in a non-guide zone E2 in response to the guided section on the most forward side X1 in the travel direction X moving from the first position P1 to the second position P2 or from the second position P2 to the first position P1.

Figure 6:
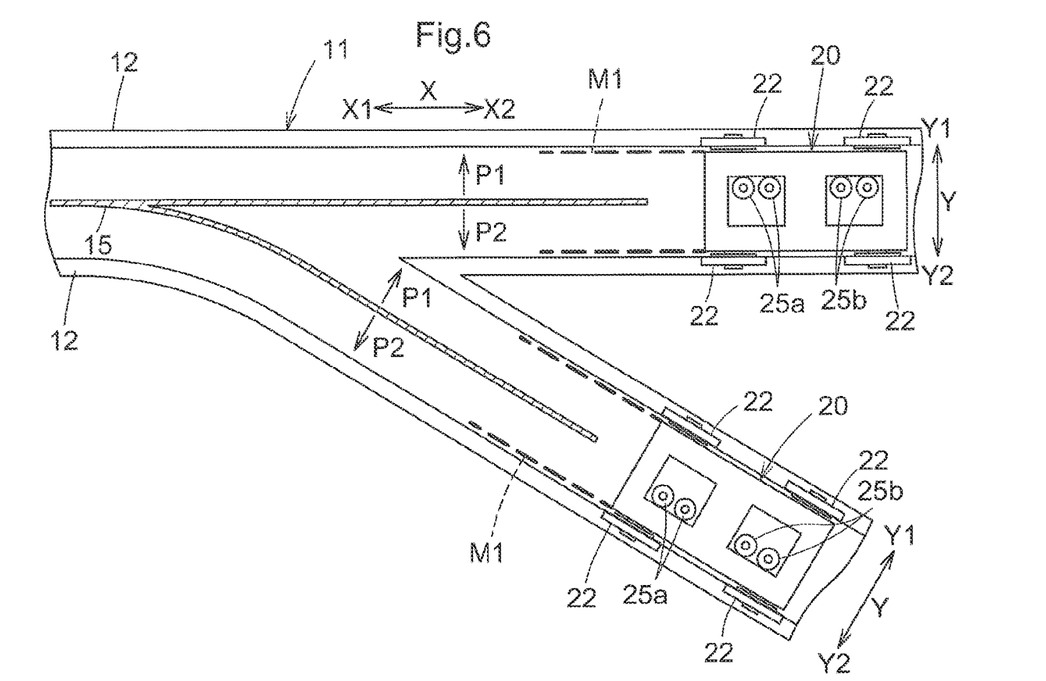
FIG. 6 is a view showing a state immediately before two transport vehicles enter the intersection zone shown in FIG. 2.
Figure 7:
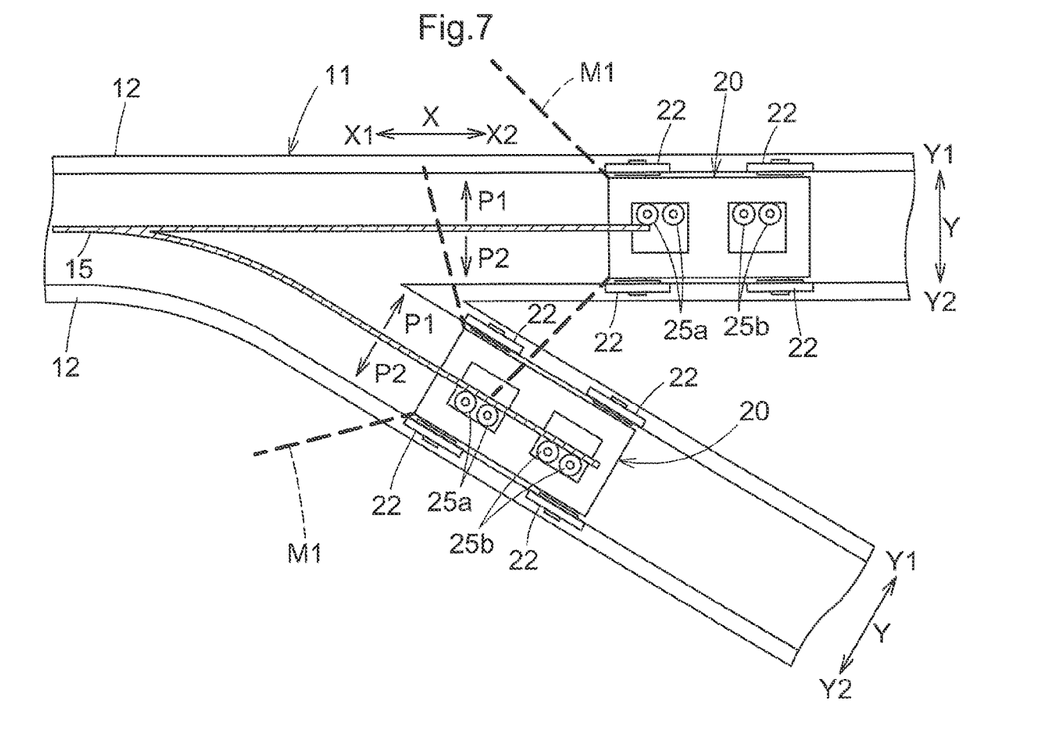
FIG. 7 is a view showing a state in which the two transport vehicles shown in FIG. 6 are traveling in the intersection zone.

FIG. 6 is a view showing a state immediately before two transport vehicles 20 enter a merge zone. FIG. 7 is a view showing a state in which two transport vehicles 20 are traveling in the merge zone. The control system 40 in this embodiment sets the detection range M1 of the obstacle sensor 31 wider in response to determining that the transport vehicle is in the guide zone E1 than in response to determining that the transport vehicle is in the non-guide zone E2 as a result of the confirmation operation. In this embodiment, the detection range M1 in the width direction Y of the obstacle sensor 31 is set wider. This change of setting is preferably performed by the control system 40 before later-described restoration processing.

In this embodiment, the detection range M1 in the width direction Y of the obstacle sensor 31 in the non-guide zones E2 is the range in which the facilities 16 (see FIG. 2) outside in the width direction Y of the travel routes 11 are not detected. The facilities 16 are outside the detection range M1 in the width direction Y of the obstacle sensor 31, in the guide zones E1.

In the example shown in FIG. 6, the control system 40 sets the detection ranges M1 to the ranges in the width direction Y corresponding to the travel paths on the forward side X1 in the travel direction X of the transport vehicles 20 in response to determining that the transport vehicles 20 are in the non-guide zone E2 as a result of the confirmation operation. Accordingly, the facilities 16 that are not obstacles in the non-guide zone E2 are not detected as obstacles. However, if the two transport vehicles 20 are subjected to later-described restoration processing and allowed to travel with the detection ranges M1 being still the ranges shown in FIG. 6, there is a possibility that the obstacle sensors 31 of the transport vehicles 20 cannot detect each other and the transport vehicles collide with each other. In the example shown in FIG. 7, if it is determined that the transport vehicles 20 are in the guide zone E1, the detection ranges M1 are set to the ranges in which other transport vehicles 20 on the forward side X1 and the lateral sides in the travel direction X can be detected. Accordingly, the obstacle sensor 31 of at least one transport vehicle 20 is more likely to detect the other transport vehicle 20. Also, the detection ranges M1 in the width direction Y of the obstacle sensors 31 are set wider in the curved zone E12, and thus obstacles on the travel routes such as other transport vehicles 20 can be detected at an early stage.

The control system 40 in this embodiment executes restoration processing to allow a transport vehicle 20 to start traveling after the specific event is resolved. The restoration processing may be ended by the control system 40, for example, after the transport vehicle 20 reads positional information of an information holder 18 (shown in FIG. 1). The restoration processing may be ended by the control system 40, for example, after the transport vehicle 20 reads the positional information of information holders 18 a plurality of times. The control system 40 in this embodiment executes normal processing after the restoration processing is ended. The normal processing is, for example, processing that transports or transfers the articles W based on information from outside the transport vehicle 20 (e.g., commands from the transport manager 41). In this embodiment, the control system 40 ends the restoration processing after the transport vehicle 20 reads the positional information of the information holder 18 and the transport manager 41 of the control system 40 is restarted, but the control system 40 may end the restoration processing immediately after the transport vehicle 20 reads the positional information of the information holder 18.

The control system 40 in the restoration processing in this embodiment causes the transport vehicle 20 to travel at or below a predetermined first speed limit V1 for restoration from when the stopped transport vehicle 20 starts traveling to when the transport vehicle 20 reads the positional information of the information holder 18 (shown in FIG. 1). The control system 40 in restoration processing in this embodiment causes the transport vehicle 20 to travel at or below the first speed limit V1 for restoration in response to determining that the transport vehicle 20 is in a non-guide zone E2 as a result of the confirmation operation, and causes the transport vehicle 20 to travel at or below a second speed limit V2 for restoration, which is lower than the first speed limit V1 for restoration in response to determining that the transport vehicle 20 is in a guide zone E1 as a result of the confirmation operation.

The control system 40 in this embodiment causes a plurality of transport vehicles 20 on which a specific event has occurred to simultaneously execute the confirmation operation in response to occurrence of the specific event on the plurality of transport vehicles 20 on the travel routes 11. In this embodiment, restoration processing (described later) is executed on the plurality of transport vehicles 20 after the confirmation operation. The confirmation operation that is simultaneously executed on the plurality of transport vehicles 20 does not have to be executed at exactly the same time. For example, the restoration processing may be executed on a plurality of transport vehicles 20 determined as being in the guide zones E1 after the restoration processing is executed on a plurality of transport vehicles 20 determined as being in the non-guide zones E2. The restoration processing may be executed on a plurality of transport vehicles 20 determined as being in the non-guide zones E2 after the restoration processing is executed on a plurality of transport vehicles 20 determined as being in the guide zones E1. The restoration processing may be executed only on transport vehicles 20 that meet a predetermined travel condition out of a plurality of transport vehicles 20. The predetermined travel condition may be, for example, that the transfer device in the body section 30 is at a predetermined travel position, that the transport vehicle 20 is not supporting the articles W, that the obstacle sensor 31 has not detected any obstacles, or that the rear-end collision prevention sensor 32 has not detected any other transport vehicles 20. According to the transport facility 10 as described above, it is sufficient that a worker approaches and restores only the transport vehicles 20 that need to be visually checked when restoring the transport vehicles 20, and thus the worker's labor for restoration after occurrence of a specific event can be reduced even in the case in which the transport facility 10 includes a plurality of transport vehicles 20.

Next, other embodiments of the transport facility 10 will be described.

(1) In the foregoing embodiment, a configuration in which the guide rail 15 is along the center in the width direction Y of the travel routes 11 and suspended from the ceiling was described as an example. However, there is no limitation to such an example, and, for example, the guide rail 15 may be on the floor. The guide rail 15 may be in contact with one of the pair of left and right travel rails 12.

(2) In the foregoing embodiment, a configuration in which the transport vehicles 20 are unmanned overhead transport vehicles and the travel routes 11 each have a pair of left and right travel rails 12 was described as an example. However, there is no limitation to such an example, and, for example, there may be only one travel rail 12 on the floor. For example, there may be no travel rails 12. The travel routes 11 may be on the floor suspended from the ceiling, for example. The transport vehicles 20 may be manned ground transport vehicles, for example. The transport vehicles 20 may be vehicles that are driven by an internal combustion engine, for example. The transport facility 10 may include only one transport vehicle 20, for example.

(3) In the foregoing embodiment, a configuration in which the transport vehicles 20 travel in one direction along the travel routes 11 was described as an example. However, there is no limitation to such an example, and, for example, the transport vehicles 20 may be configured to travel in both the front and rear directions along the travel routes 11. The obstacle sensor 31 or the rear-end collision prevention sensor 32 may be on the faces on both the forward side X1 and the rearward side X2 of each transport vehicle 20.

(4) In the foregoing embodiment, a configuration in which each transport vehicle 20 includes the obstacle sensor 31 and the rear-end collision prevention sensor 32 was described as an example. However, there is no limitation to such an example, and, for example, the transport vehicle 20 does not have to include the obstacle sensor 31. The transport vehicle 20 does not have to include the rear-end collision prevention sensor 32.

(5) In the foregoing embodiment, a configuration in which the information holders 18 are at a plurality of points along the travel routes 11 and the transport vehicles 20 include the readers 28 was described as an example. However, there is no limitation to such an example, and, for example, there may be only one information holder 18 on the travel routes 11. For example, there may be no information holders 18, and a worker may input information on the travel position to the transport vehicles 20 at a predetermined position on the travel routes 11.

(6) In the foregoing embodiment, a configuration in which each transport vehicle 20 includes the first travel section 21a and the second travel section 21b and further includes two first guided sections 25a and two second guided sections 25b was described as an example. However, there is no limitation to such an example, and, for example, the transport vehicle 20 may include one first guided section 25a and one second guided section 25b. The transport vehicle 20 may not include the second guided sections 25b and the second travel section 21b. The drive section 23 for traveling may be in one of the first travel section 21a and the second travel section 21b, and the wheels 22 in the other travel section may follow the driving.

(7) In the foregoing embodiment, a configuration in which the first guided sections 25a and the second guided sections 25b are guide wheels was described as an example. However, there is no limitation to such an example, and, for example, the first guided sections 25a and the second guided sections 25b may be configured to slide on and be guided by the guide rail 15. The first guided sections 25a may be, for example, guide wheels and support sections that support the guide wheels, and the guide drive section 24 may be configured to drive the support sections together with the guide wheels in the width direction Y.

(8) In the foregoing embodiment, a configuration in which the first detecting section 27a can detect whether the first guided sections 25a are at the first position P1 or the second position P2 was described as an example. However, there is no limitation to such an example, and, for example, a configuration may be adopted that detects whether or not the first guided sections 25a have moved from the first position P1 to the second position P2 or from the second position P2 to the first position P1, by detecting the drive or rotation of the guide drive section 24. A configuration may be adopted that detects whether or not the first guided sections 25a have moved from the first position P1 to the second position P2 or from the second position P2 to the first position P1, for example, by detecting whether or not the first guided sections 25a pave passed through an intermediate position between the first position P1 and the second position P2.

(9) In the foregoing embodiment, a configuration in which the control system 40 sets the detection range M1 in the width direction Y of the obstacle sensor 31 wider in response to determining that the transport vehicle is in the guide zone E1 than in response to determining that the transport vehicle is in the non-guide zone E2 was described as an example. However, there is no limitation to such an example, and, for example, a configuration may be adopted that sets the detection range M1 longer in the up-down direction Z or the travel direction X of the obstacle sensor 31.

Hereinafter, the transport facility in the foregoing description will be described.

The present disclosure is directed to a transport facility including: a transport vehicle configured to travel along a travel route; a guide rail along the travel route; and a control system configured to control the transport vehicle, wherein, with a travel direction being a direction along the travel route, a width direction being a direction orthogonal to the travel direction in a vertical view, a first side in the width direction being one side in the width direction, and a second side in the width direction being another side in the width direction, the transport vehicle includes: a guided section configured to be guided by the guide rail; and a guide drive section configured to drive the guided section in the width direction to move the guided section to a first position on the first side in the width direction of the guide rail and to a second position on the second side in the width direction of the guide rail, the travel route includes a guide zone in which the guide rail is disposed and a non-guide zone in which the guide rail is not disposed, and, in response to occurrence of a specific event in which the transport vehicle loses information on a travel position thereof, the control system (i) causes the guide drive section to execute a confirmation operation to drive the guided section in the width direction, (ii) determines that the transport vehicle is in the non-guide zone in response to the guided section moving from the first position to the second position or from the second position to the first position in the confirmation operation, and (iii) determines that the transport vehicle is in the guide zone in response to the guided section being prevented from moving from the first position to the second position or from the second position to the first position in the confirmation operation.

This configuration makes it possible to determine whether a transport vehicle is in the guide zone or the non-guide zone, through a confirmation operation to drive the guided section in the width direction, even if a specific event in which the transport vehicle loses information on its travel position occurs. Accordingly, the control system can cause the transport vehicle to perform proper control according to whether the transport vehicle is in the guide zone or the non-guide zone. Therefore, the control system can properly resume control of the transport vehicle, even if a specific event in which the transport vehicle loses information on its travel position occurs.

According to an aspect, it is preferable that the transport vehicle further includes an obstacle sensor configured to detect an obstacle on a forward side in the travel direction, the guide rail is in at least either a zone in which the travel route intersects another travel route or a zone in which the travel route is curved, and the control system sets a detection range of the obstacle sensor wider in response to determining that the transport vehicle is in the guide zone than in response to determining that the transport vehicle is in the non-guide zone as a result of the confirmation operation.

This configuration makes it possible to properly set a detection range of the obstacle sensor according to whether the transport vehicle is in the guide zone or the non-guide zone. Therefore, it is possible to increase the possibility of proper detection of obstacles such as other transport vehicles in branch or merge parts of the guide zone, while reducing the possibility of false detection in which objects that are not obstacles are detected as obstacles in the non-guide zone. Accordingly, the control system can cause the transport vehicle to properly travel upon resuming the control of the transport vehicle.

According to an aspect, it is preferable that the transport facility further includes an information holder holding positional information on a position thereof, at each of a plurality of points along the travel route, wherein the transport vehicle further includes a reader configured to read the positional information of the plurality of information holders and recognize a travel position of the transport vehicle based on the information read by the reader, the control system executes restoration processing to allow the transport vehicle to start traveling after the specific event is resolved, and the transport vehicle in the restoration processing is caused to travel at or below a predetermined first speed limit for restoration from when the stopped transport vehicle starts traveling to when the transport vehicle reads the positional information of an information holder among the plurality of information holders.

This configuration makes it possible to cause the transport vehicle to travel at low speed that is at or below the first speed limit for restoration, while causing the transport vehicle to perform control according to whether the transport vehicle is in the guide zone or the non-guide zone based on the confirmation operation even if a specific event occurs and the transport vehicle loses information on its travel position. Accordingly, it is possible to automatically execute a series of processing from completing the restoration processing by causing the transport vehicle to travel and recognize its travel position to returning to normal processing, while reducing the possibility of issues such as the transport vehicle colliding with another transport vehicle.

According to an aspect, it is preferable that, in the restoration processing, the control system (i) causes the transport vehicle to travel at or below the first speed limit for restoration in response to determining that the transport vehicle is in the non-guide zone as a result of the confirmation operation, and (ii) causes the transport vehicle to travel at or below a second speed limit for restoration, which is lower than the first speed limit for restoration, in response to determining that the transport vehicle is in the guide zone as a result of the confirmation operation.

This configuration makes it possible to further reduce the possibility of issues such as the transport vehicle colliding with another transport vehicle.

According to an aspect, it is preferable that in response to occurrence of the specific event on a plurality of transport vehicles on the travel route, the control system causes the plurality of transport vehicles to simultaneously execute the confirmation operation.

This configuration makes it possible to reduce the worker's labor for restoration after occurrence of a specific event, even in the case in which there are a plurality of transport vehicles.

According to an aspect, it is preferable that the transport vehicle includes a first guided section that is the guided section, and a second guided section on a rearward side of the first guided section in the travel direction, the guide drive section drives the first guided section and the second guided section independently of each other in the width direction, and in response to occurrence of the specific event, the control system (i) causes the confirmation operation to be executed for both the first guided section and the second guided section, (ii) determines that the transport vehicle is in the non-guide zone in response to both the first guided section and the second guided section moving from the first position to the second position or from the second position to the first position in the confirmation operation, and (iii) determines that the transport vehicle is in the guide zone in response to at least either the first guided section or the second guided section being prevented from moving from the first position to the second position or from the second position to the first position in the confirmation operation.

This configuration makes it possible to properly execute the confirmation operation and determination based on the confirmation operation even in the case in which the transport vehicle includes a plurality of guided sections that are along the travel direction.

What is claimed is:

1. A transport facility comprising:
a transport vehicle configured to travel along a travel route;
a guide rail along the travel route; and
a control system configured to control the transport vehicle, and
wherein:
a travel direction is a direction along the travel route, a width direction is a direction orthogonal to the travel direction in a vertical view, a first side in the width direction is one side in the width direction, and a second side in the width direction is another side in the width direction,
the transport vehicle comprises:
   a guided section configured to be guided by the guide rail; and
   a guide drive section configured to drive the guided section in the width direction to move the guided section to a first position on the first side in the width direction of the guide rail and to a second position on the second side in the width direction of the guide rail,
the travel route comprises a guide zone in which the guide rail is disposed and a non-guide zone in which the guide rail is not disposed, and
in response to occurrence of a specific event in which the transport vehicle loses information on a travel position thereof, the control system (i) causes the guide drive section to execute a confirmation operation to drive the guided section in the width direction, (ii) determines that the transport vehicle is in the non-guide zone in response to the guided section moving from the first position to the second position or from the second position to the first position in the confirmation operation, and (iii) determines that the transport vehicle is in the guide zone in response to the guided section being prevented from moving from the first position to the second position or from the second position to the first position in the confirmation operation.

2. The transport facility according to claim 1, wherein:
the transport vehicle further comprises an obstacle sensor configured to detect an obstacle on a forward side in the travel direction,
the guide rail is in at least either a zone in which the travel route intersects another travel route or a zone in which the travel route is curved, and the control system sets a detection range of the obstacle sensor wider in response to determining that the transport vehicle is in the guide zone than in response to determining that the transport vehicle is in the non-guide zone as a result of the confirmation operation.

3. The transport facility according to claim 1, further comprising:
an information holder holding positional information on a position thereof, at each of a plurality of points along the travel route, and
wherein:
the transport vehicle further comprises a reader configured to read the positional information of the plurality of information holders and recognize a travel position of the transport vehicle based on the information read by the reader,
the control system executes restoration processing to allow the transport vehicle to start traveling after the specific event is resolved, and
the transport vehicle in the restoration processing is caused to travel at or below a predetermined first speed limit for restoration from when the stopped transport vehicle starts traveling to when the transport vehicle reads the positional information of an information holder among the plurality of information holders.

4. The transport facility according to claim 3,
wherein, in the restoration processing, the control system (i) causes the transport vehicle to travel at or below the first speed limit for restoration in response to determining that the transport vehicle is in the non-guide zone as a result of the confirmation operation, and (ii) causes the transport vehicle to travel at or below a second speed limit for restoration, which is lower than the first speed limit for restoration, in response to determining that the transport vehicle is in the guide zone as a result of the confirmation operation.

5. The transport facility according to claim 1, wherein in response to occurrence of the specific event on a plurality of transport vehicles on the travel route, the control system causes the plurality of transport vehicles to simultaneously execute the confirmation operation.

6. The transport facility according to claim 1, wherein:
the transport vehicle comprises a first guided section that is the guided section, and a second guided section on a rearward side of the first guided section in the travel direction,
the guide drive section drives the first guided section and the second guided section independently of each other in the width direction, and
in response to occurrence of the specific event, the control system (i) causes the confirmation operation to be executed for both the first guided section and the second guided section, (ii) determines that the transport vehicle is in the non-guide zone in response to both the first guided section and the second guided section moving from the first position to the second position or from the second position to the first position in the confirmation operation, and (iii) determines that the transport vehicle is in the guide zone in response to at least either the first guided section or the second guided section being prevented from moving from the first position to the second position or from the second position to the first position in the confirmation operation.

* * * * *